United States Patent [19]

Kurakado et al.

[11] Patent Number: 5,753,935
[45] Date of Patent: May 19, 1998

[54] SUPERCONDUCTIVE TUNNEL JUNCTION ARRAY RADIATION DETECTOR

[75] Inventors: Masahiko Kurakado; Atsuki Matsumura; Tooru Takahashi, all of Kanagawa-ken, Japan

[73] Assignee: Nippon Steel Corporation, Tokyo, Japan

[21] Appl. No.: 996,516

[22] Filed: Dec. 23, 1992

Related U.S. Application Data

[63] Continuation of Ser. No. 673,063, Mar. 22, 1991, abandoned.

[30] Foreign Application Priority Data

Mar. 26, 1990 [JP] Japan .................... 2-73430

[51] Int. Cl.$^6$ .............. H01L 31/0256; H01L 39/22; G01J 1/00; G01N 24/00
[52] U.S. Cl. .............. 257/31; 257/35; 250/336.2; 505/843; 505/849; 505/866
[58] Field of Search ............ 357/4, 30, 5, 30 H; 250/336.2; 505/843, 848, 849, 866; 257/31, 35

[56] References Cited

FOREIGN PATENT DOCUMENTS

| 0375465A2 | 6/1990 | European Pat. Off. |
| 59-81563 | 5/1984 | Japan .................... 250/336.2 |
| 60-253929 | 12/1985 | Japan .................... 357/30 |

OTHER PUBLICATIONS

Ishibashi et al., "Possible Use of Bulk Superconductor with Tunnel Junctions for Nuclear Radiation Spectroscopy", Nuclear Instruments & Methods in Physics Reserach, vol. 227, No. 3, Dec. 1, 1984, pp. 483–488.

Iruin et al., "Planow Antenna–Coupled SIS Devices for Detection and Mixing", Conference Digest of 6th International Conference on Infrazed & Millimeter Waves, Dec. 7–12, 1981, 2 pages.

Enomoto et al, "Optical Detector Using Superconducting $BaPb_{0.7}Bi_{0.3}O_3$ Thin Films", Journal of Applied Physics, vol. 59, No. 11, Jun. 1, 1986, pp. 3807–3814.

Enomoto et al, "Highly Sensitive Optical Detector Using Superconducting Oxide $BaPb_{0.7}Bio_{3O3}$ (BPB)", Japanese Journal of Applied Physics, vol. 23, No. 5, May 1984, pp. L333–335.

Kurakado et al, "Possibility of A High–Resolution Nuclear Radiation Detector Using A Superconductor", Nuclear Instruments and Methods, vol. 185, 1981, pp. 149–155.

Neuhauser, et al, "Acoustic Detection of Single Particles for Neutrin Experiments and Darle Matter Searches," IEEE Trans, on May, vol. 23, No. 2, Mar. 1987, pp. 469–472

Young et al, "Phonon–Mediated Detection of X–Rays in Silicon Crystals Using Superconducting Transition Phonom Sensors, " IEEE Trans, on May, vol. 25, No. 2, Mar. 1989, pp. 1347–1350.

Niemeyer et al "Josephson Voltage Standard Array" *Jpn J. Appl. Phys* vol. 25 (1986) L 343–345.

Rzchowski et al "Vortex Pinning in Josephson–junction Arrays," *American Phys. Society* (1990) pp. 2041–2050.

(List continued on next page.)

*Primary Examiner*—Carl W. Whitehead
*Assistant Examiner*—Alice W. Tang
*Attorney, Agent, or Firm*—Wenderoth, Lind & Ponack

[57] ABSTRACT

In a radiation detection device using superconducting tunnel junctions, the increase in electric capacitance and the decrease in electric resistance due to the increase in junction area for improvement of the detection efficiency are largely repressed by the invention. The junctions are connected in series. The number of the series-connected junctions is settled in the range of larger than 0.05 $(SC_o/C')0.5$ and smaller than 20 $(SC_o/C')0.5$ or $10SCo/C'$, whichever is larger, where S is the total area of the junctions, cm$^2$, $C_o$ is the electric capacitance per unit area of the junctions, F/cm$^2$, and C' is the electric capacitance connected to the device in parallel so as to transfer and amplify the signals from the device, F.

10 Claims, 12 Drawing Sheets

OTHER PUBLICATIONS

Ito et al "Highly Sensitive Photodetection Using a Microwave–Coupled BaPbBi$_{O3}$ Josephson Junction Array" *Appl. Phys Lett* vol. 43(3) 8/83 pp. 314–316.

Enomoto e al.; "Highly Sensitive Optical Detector Using Superconducting Oxide BaPb$_{0.7}$Bi$_{0.3}$O$_3$(BPB)"; Japanese Journal of Applied Physics; vol. 23, No. 5; May 1984; pp. L333–335.

Enomoto et al.; "Optical detector using superconducting BaPb$_{0.7}$Bi$_{0.3}$O$_3$ thin"; Japanese Applied Physics, vol. 59, No. 11; Jun. 1986; pp. 3807–3814.

Benz et al.; "Fractional Giant Shaprio Steps and Spatially Correlated Phase Motion in 2D Josephson Arrays"; Physical Review Letters; vol. 64; No. 6; Feb. 1990; pp. 693–696.

M. Kurakado, Nuclear Instruments and Method 169 (1982) 275–277, "Possibility Of High Resolution Detectors Using Superconducting Tunnel Junctions".

A. Shoji et al., Appl. Phys. Lett. 41 (1982) 1097, "New Fabrication Process For Josephson Tunnel Junctions With (Niobium Nitride, Niobium) Double–Layered Electrodes".

F. Hebrank et al., Nuclear Instrument and Methods in Physics Research. A288, Mar. 15, (1990), 541–548, "Nb–AiO$_x$–Nb Tunnel Junctions as Detectors For Ionizing Radiation".

M. Kurakado, Applied Physics, vol. 53, No. 6, pp. 532–537 (1984) (partial translation) "Nuclear Radiation Detection With Superconducting Tunnel Junctions".

A. Barone "Superconductive Particle Detectors", (1988), World Scientific.

M. Kurakado et al., Jpn. J. Appl. Phys. 28 (1989) L459–L461, "X–Ray Detection With Nb/AIO$_x$/Nb Superconductor Detectors".

M. Kurakado, J. Appl. Phys. 55 (1984) 3185–3187, "Alpha–Particle Detection With Superconductor Detectors".

M. Kurakado et al., Technical Digest of the 8th Sensor Symposium, 1989, pp. 247–250, "X–Ray Detection With Nb/AIO$_x$/Nb Superconductor Dectectors".

J. Niemeyer et al., Jpn. J. Appl. Phys. 25 (1986) L343–345, "Nb/Al–Oxide/Nb and NbN/MgO/NbN Tunnel Junctions In Large Series Arrays For Voltage Standards".

SUPERCONDUCTIVE TUNNEL JUNCTION ARRAY RADIATION DETECTOR

This application is a Continuation of now abandoned application, Ser. No. 07/673,063, filed Mar. 22, 1991.

BACKGROUND OF THE INVENTION

1. Field of the Invention

This invention relates to a radiation detection device and a radiation detector. More particularly, this invention relates to a device and a detector for the measurement of radiation energy or light intensity by the use of superconducting tunnel junctions.

2. Description of the Prior Art

The radiation detection device using a superconducting tunnel junction can achieve more than a thousand times greater signal charge and more than a ten times greater energy-resolution than the high resolution semiconductor detection device. Studies aimed at developing such a radiation detection device are well under way ("Applied Physics," Vol. 53, No. 6, pages 532 to 537 (1984), "Superconductive Particle Detectors," complied by A. Barone and published by World Scientific (1988), etc.). The common term "light" actually denotes an electromagnetic wave, similar to X ray radiation. The superconducting tunnel junction photosensor may become highly sensitive to light energy of a wide wavelength from the far-infrared to the ultraviolet.

Heretofore, for the detection of radiation (such as X ray radiation and light energy) using the superconducting tunnel junction, a device comprising only one junction as illustrated in FIG. 2 and FIG. 3 has been developed. In the detection device illustrated in FIG. 2 and FIG. 3, a thin insulating layer (tunnel barrier layer) 103 is disposed throughout the entire junction between a superconductor 101 serving as a lower electrode and a superconductor 102 serving as a counter electrode. The counter superconductor electrode 102 is configured to cover the upper surface and one lateral surface of the lower superconductor electrode 101. In FIG. 3, the reference numeral 111 denotes an upper wiring and the reference numeral 112 a lower wiring.

To improve the performance of a radiation detection device or a photosensor, the area of the superconductor having the radiation energy or photon energy incident thereto must be increased for enhancing the detection efficiency of the impinging radiation or photons. In the device constructed as illustrated in FIG. 2 and FIG. 3, however, an enlargement of the area A entails a problem in that the electric capacitance C of the tunnel junction increases and the radiation or photon detection signal V decreases. The voltage variation V which is generated by a signal charge Q between the opposite terminals of junction will be Q/C at most. Since C is in direct proportion to A, the signal decreases in proportion as A increases. In the superconducting tunnel junction, the electric capacitance per unit area is extremely large (about 6 µF/cm² in a Nb/AlO$_x$/Nb junction) because the thickness of the insulation layer is smaller than some tens of Å. In the case of a junction 1 cm² in area, for example, the electric capacitance C of a semiconductor radiation detector is on the order of some tens to hundreds pF, whereas that of the Nb/AlO$_x$/Nb junction is 6 µF, a magnitude which is $10^4$ to $10^5$ times larger than that of the semiconductor detector. Even when the signal charge Q is several thousand times larger than that of the semiconductor, a junction measuring not less than several hundred µm×several hundred µm in area cannot be expected to possess a high sensitivity or high energy-resolution because a decrease in signal voltage results in a proportionate increase in the influence of the electric noise generated by an amplifier, for example.

Another reason rendering it difficult to increase the area of a superconducting tunnel junction in the detection device include the problem of the electric resistance R of the device mentioned above.

The term "electric resistance of the device" to be used herein refers to the magnitude of the dynamic resistance to be exhibited at the bias point when a voltage not exceeding a voltage ($E_g$/e) equivalent to the gap energy $E_g$ of the superconductor per junction is applied to the superconducting tunnel junction while a magnetic field is applied thereto to repress the DC Josephson effect.

A radiation detection device having a small electric resistance R cannot be expected to possess a high sensitivity or high energy-resolution because a decrease in the electric resistance R results in an increase in the electric noise and a decrease in the magnitude of the detection signal (Jpn J. Appl. Phys., 28 (1989), L459, for example). The thickness of the insulation layer (tunnel barrier) may be increased for the purpose of increasing the electric resistance R of the superconducting tunnel junction. An increase in the thickness of the insulation layer, however, inevitably results in lowering the charge collection efficiency and the charge collection speed by the tunnel effect.

The technique generally resorted to in coping with this problem, therefore, resides in decreasing the tunnel current caused by the thermally excited electrons by forming the insulation layer of a small thickness (10 to 30 Å) and amply lowering the temperature, T, of the superconducting tunnel junction while in service below the critical temperature, $T_c$, of superconduction (T is smaller than 0.2$T_c$) (J. Appl. Phys., 55)1984 3185, for example). Theoretically, the tunnel current ought to be diminished substantially to zero and the electric resistance of the junction sufficiently increased by amply lowering the temperature. Actually, however, this relation is not realized very easily. This is because the tunnel current due to the tunnel effect is accompanied by a leak current due to defects in the junction. The leak current includes a surface leak caused by defects in the surface of the tunnel barrier and an edge leak caused by defects in the edge part of junction. It is generally held that the surface leak current is proportional to the area of junction and the edge leak current is proportional to the length of the side edge of the junction. An experiment conducted on a Nb/AlO$_x$/Nb junction to test for leak current (Technical Digest of the 8th Sensor Symposium, 1989, pp. 247) has revealed that the total leak current is mainly made up of edge leak current. The leak current of this nature is a major factor rendering it difficult to increase the area of the superconducting radiation detector.

Thus, the conventional radiation detector using a superconducting tunnel junction has suffered from a serious disadvantage in that it is difficult to obtain a large increase in the junction area to thereby improve the detection efficiency.

J. Niemeyer et al. have reported their success in increasing the output voltage of a voltage standard by using a device comprising of a series array of some thousands of Josephson junctions (J. Niemeyer at al.: Jpn. J. Appl. Phys., 25 (1986) L343–345). The Josephson voltage standard of this nature, however, is entirely different in working principle from the radiation detection device aimed at by the present invention. Further, it is not necessary for the voltage standard to optimize the number of Josephson junctions in order to decrease the electric capacitance C. Namely, in the voltage standard, if a microwave radiation with the frequency $\omega_r$ is provided to one Josephson junction, constant voltage steps appear in the static current-voltage characteristic of the Josephson junction at $$V=(n\text{-}h/2e)\omega_r \ (n=1,2,3,\ldots).$$

The value of one voltage step is $(\text{-}h/2e)\omega_r$. The value of a voltage step, therefore, varies only according to the $\omega_r$ value, but not according to the type of material and the junction area value of the Josephson junction. The purpose of fabricating a series array of junctions for the voltage standard is to improve the preciseness of the voltage measurement. As for the voltage standard, therefore, even if it comprises a series array of Josephson junctions, there is no need to seek an optimum condition for the number of junctions. Further, the voltage standard is realized by utilizing the Josephson effect, while the radiation detector aimed at by the present invention is realized by utilizing the tunnel effect.

SUMMARY OF THE INVENTION

An object of this invention, therefore, is to provide a novel radiation detection device and a radiation detector which is devoid of the problems of the prior art mentioned above. More particularly, this object resides in providing a radiation detection device and a radiation detector which allow notable repression of the increase in electric capacitance and the decrease in electric resistance of the device resulting from the increase in the area of the detection device.

The object mentioned above is accomplished by a radiation detection device comprising a plurality of superconducting tunnel junctions connected in series, where the number of the junctions being not less than four and more than $0.05(SC_o/(20\times10^{-12} \text{ F}))^{0.5}$, and less than the larger of $20(SC_o/(5\times10^{-12} \text{ F}))^{0.5}$ or $10 \ SC_o/(5\times10^{-12} \text{ F})$, where S is the total area of the junctions in cm$^2$, and $C_o$ is the electric capacitance per unit area of the junctions in F/cm$^2$.

The object is further accomplished by a radiation detection device comprising at least two members connected in parallel, each of the members being one of a superconducting tunnel junction and series arrays of superconducting tunnel junctions, where the number of the junctions, in at least one of the members, is not less than four and more than $0.05(SC_o/(20\times10^{-12} \text{ F}))^{0.5}$, and less than the larger of $20(SC_o/(5\times10^{-12} \text{ F}))^{0.5}$ or $10 \ SC_o/(5\times10^{-12} \text{ F})$, where S is the total area of the junctions in cm$^2$, and $C_o$ is the electric capacitance per unit area of the junctions in F/cm$^2$.

The object is also accomplished by a radiation detector comprising a radiation detection device and a signal amplifier, the radiation detection device comprising a plurality of superconducting tunnel junctions connected in series, and the number of the junctions being not less than four and more than $0.05(SC_o/C')^{0.5}$, and less than the larger of $20(SC_o/C')^{0.5}$ or $10 \ SC_o/C'$, where S is the total area of the junctions in cm$^2$, $C_o$ is the electric capacitance per unit area of the junctions in F/cm$^2$, and C' is the input electric capacitance on the signal amplifier side as viewed relative to the device in F.

Further, the object is accomplished by a radiation detector comprising a radiation detection device and a signal amplifier, the radiation detection device comprising at least two members connected in parallel, each of the members being one of a superconducting tunnel junction and series arrays of superconducting tunnel junctions, where the number of the junctions, in at least one of the members, is not less than four and more than $0.05(SC_o/C')^{0.5}$, and less than the larger of $20(SC_o/C')^{0.5}$ or $10 \ SC_o/C'$, where S is the total area of the tunnel junctions in cm$^2$, $C_o$ is the electric capacitance per unit area of the junctions in F/cm$^2$, and C' is the input electric capacitance on the signal amplifier side as viewed relative to the device in F.

DETAILED DESCRIPTION OF THE INVENTION

Figure 4:
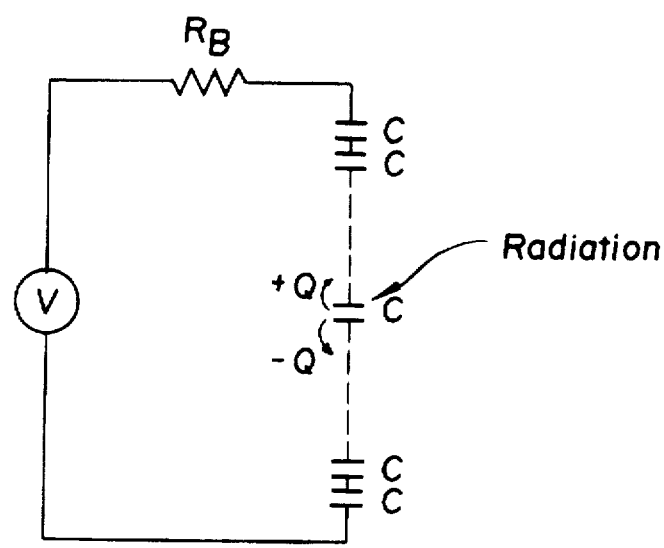
FIG. 4 is an explanatory diagram illustrating the occurrence of a signal charge Q due to the impinging radiation in the device having series arrayed junctions according with this invention.

To explain the operation of this invention, a radiation detection device having n junctions electrically connected in series will be discussed. First, it is assumed that the junctions each possess an equal electric capacitance C, the leak current is amply small, and the magnitude of electric resistance is infinite. To this device having series arrayed junctions is externally applied a bias voltage through a large resistance $R_B$ (FIG. 4). The circuit for this bias will be omitted from the following diagrams because the charge generated by radiation energy and the change of voltage are exclusively important for the generation of a signal. With respect to voltage, only the variation in voltage will be indicated.

When radiation impinges upon one of the junctions of the device which is not connected to a signal amplifier, electrons (quasi-particles) which are excited by the radiation in the junction pass through the tunnel barrier of the junction by the tunnel effect, and a charge Q is generated at the junction. Due to this charge Q, a voltage (alteration), $V=Q/C$, occurs at this junction, and also in the device as a whole.

Figure 5:
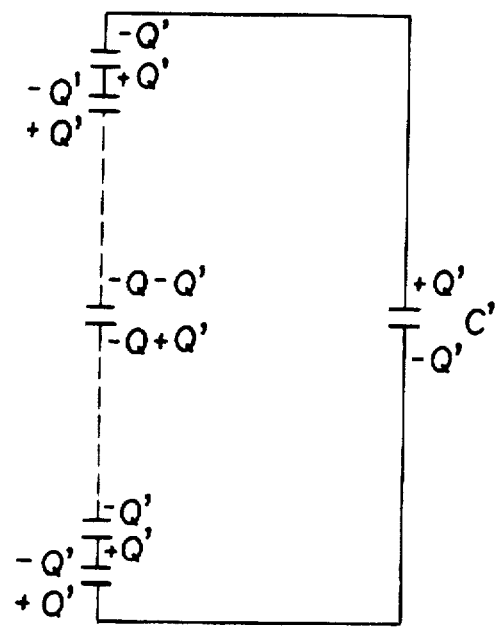
FIG. 5 is an explanatory diagram illustrating the distribution of an inductive charge Q' due to the signal charge Q.

Actually, when the device is used as a radiation detector, for the purpose of amplifying the signal and transforming the impedance, a signal conductor is led out of the device and connected to an amplifier such as a FET. The charge condition which consequently comes into existence is illustrated in FIG. 5. The symbol C' found in the diagram denotes the sum of the input electric capacitance of the signal amplifier and the electric capacitance of the signal conductor. For the signal voltage, $V_s$, to occur at the input to the amplifier, the charge $Q'=V_sC'$ ought to be produced in C'. This charge consequently likewise occurs at each of the junctions of the device as illustrated in FIG. 5. The following equations are established since the voltage applied to the entire device having series arrayed junctions equals the voltage ($V_s$) which applies to C:

$$V_s = -\frac{Q'}{C} \times (n-1) + \frac{Q-Q'}{C} = \frac{Q'}{C'} \tag{1}$$

From these equations, the following equation is obtained.

$$Q' = \frac{Q}{C} \times \frac{1}{\frac{1}{C'} + \frac{n}{C}} \tag{2}$$

The signal voltage $V_s$ which applies to the input of the amplifier, therefore, is expressed as follows.

$$V_s = \frac{Q}{C + nC'} \tag{3}$$

This magnitude is different from the voltage, which occurs when a charge Q is imparted from an external source to a circuit which has an electric capacitance C' connected in parallel with a serial array of n junctions having an electric capacitance C.

$$\frac{Q}{\frac{C}{n} + C'}$$

or from the voltage, Q/C, which occurs in the absence of the amplifier.

Incidentally, the equation (3) has been derived with due respect to the case in which the charge Q is generated by the radiation energy at a certain junction. All of the n junctions composing the device severally generate charges simultaneously, however, when the entire device is exposed to a pulse light energy. Let $Q_1, Q_2, \ldots Q_n$ denote these charges and define Q as $Q=Q_1+Q_2+\ldots +Q_n$. Then, the signal voltage $V_s$ is expressed by the equation (3). In other words, the equation (3) can be employed in its unmodified form when Q is considered as representing the charge to be generated in the entire device responsive to radiation or light energy.

Figure 2:
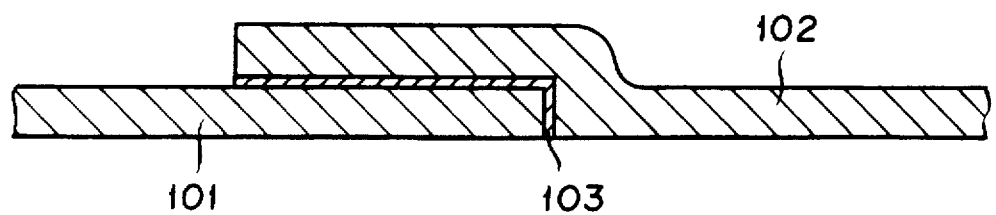
FIG. 2 is a cross section view illustrating the construction of one example of the conventional radiation detection device using a superconducting tunnel conjunction.
Figure 3:
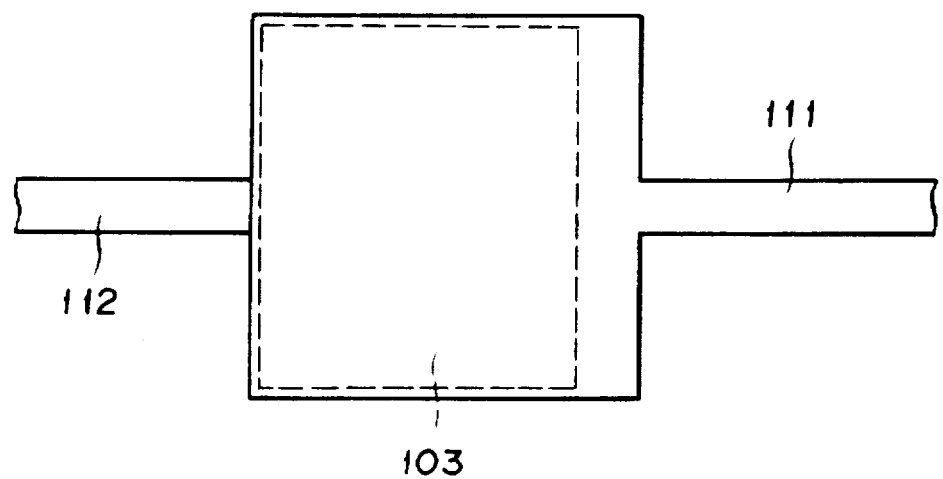
FIG. 3 is a plain view illustrating the same conventional radiation detection device.

In the present discussion, the individual junctions are assumed to possess a simple construction as illustrated in FIG. 2 and FIG. 3. When the individual junctions are constructed as described in detail in U.S. patent application Ser. No. 07/454,149 of Kurakado et al. dated Dec. 21, 1989 which is incorporated herein by reference and are used in an embodiment of this invention, the device naturally enjoys a further addition to the junction area as compared with the device using the conventional simple junctions. To be specific, in a preferred embodiment of this invention the junctions are each in the construction of superconductor layer—tunnel barrier layer—superconductor layer or superconductor layer—tunnel barrier layer—semiconductor layer, wherein the tunnel barrier layer comprises a thin-wall portion capable of passing therethrough excited electrons by the tunnel effect and a thick-wall portion having a thickness not less than twice the thickness of the thin-wall portion, each extending adjacent each other in a same plane perpendicular to the layers superposing direction, and wherein a cross-sectional pattern of the thin-wall portion within that of the thick-wall portion along the same plain is substantially uniformly distributed in one of an intermittent pattern and a continuous pattern, and wherein a cross-sectional area along the same plain of the thin-wall portion is less than that of thick-wall portion.

Now, the mechanism by which the series-connected arrangement of junctions and the optimization of the number of junctions bring about an addition to the junction area accompanied by a repression of the increase in electric capacitance and the decrease in electric resistance will now be explained. When the junctions of the conventional simple type are employed for this invention, the total area S of a radiation detection device composed of a series array of n such junctions is n times the area A of each of the junctions.

$$S = nA \tag{4}$$

Assume $C_o$ denotes the electric capacitance per unit area of the superconducting tunnel junction, then the following equation will be established.

$$C = AC_o = \frac{1}{n} SC_o \tag{5}$$

The signal voltage $V_s$ is, therefore, given by $$V_s = \frac{Q}{\frac{1}{n} SC_o + nC'} \tag{6}$$

It is noted from the equation (6) that the magnitude of the signal, $V_s$, hinges heavily on the numeral n when the total area S of the detector is fixed. $V_s$ decreases alike when the numeral n is unduly small or unduly large. When the numeral n satisfies the following equation, $$n = n_{opt} = \sqrt{\frac{SC_0}{C'}} \tag{7}$$

$V_S$ reaches its maximum, $V_{S,max}$, as follows.

$$V_{S,max} = \frac{Q}{2\sqrt{SC_oC'}} \tag{8}$$

Assume $C_{eff}$ (hereinafter referred to as "effective electric capacitance") denotes the denominator of the right part of the expression (6), then the following equations are satisfied.

$$V_s = \frac{Q}{C_{eff}} \tag{9}$$

$$C_{eff} = \frac{1}{n} SC_o + nC = C + nC \tag{10}$$

$C_{eff}$ reaches its minimum $C_{eff,min}$ when n is $n_{opt}$.

$C_{eff}$ in the equation (10) depends on the numeral n, and therefore may be denoted as $C_{eff}(n)$. Thus, $C_{eff}$ in the conventional device with the area S is expressed as $C_{eff}(1)$. The following equations are induced.

$$C_{eff}(1) = SC_o + C' \tag{11}$$

$$C_{eff}(n_{opt}) = C_{eff,min} = 2\sqrt{SC_oC'} \tag{12}$$

For the magnitude of $V_s$ to be increased as much as possible, $C_{eff}$ is desired to be as small as possible. It is clear from the equation (11), and from the equation (12) as well, that the magnitude of C' is desired to be as small as permissible. Actually, in the radiation detector or the photosensor, it is usual to decrease the magnitude of C' to the fullest possible extent below the level of some tens of pF.

Figure 6:
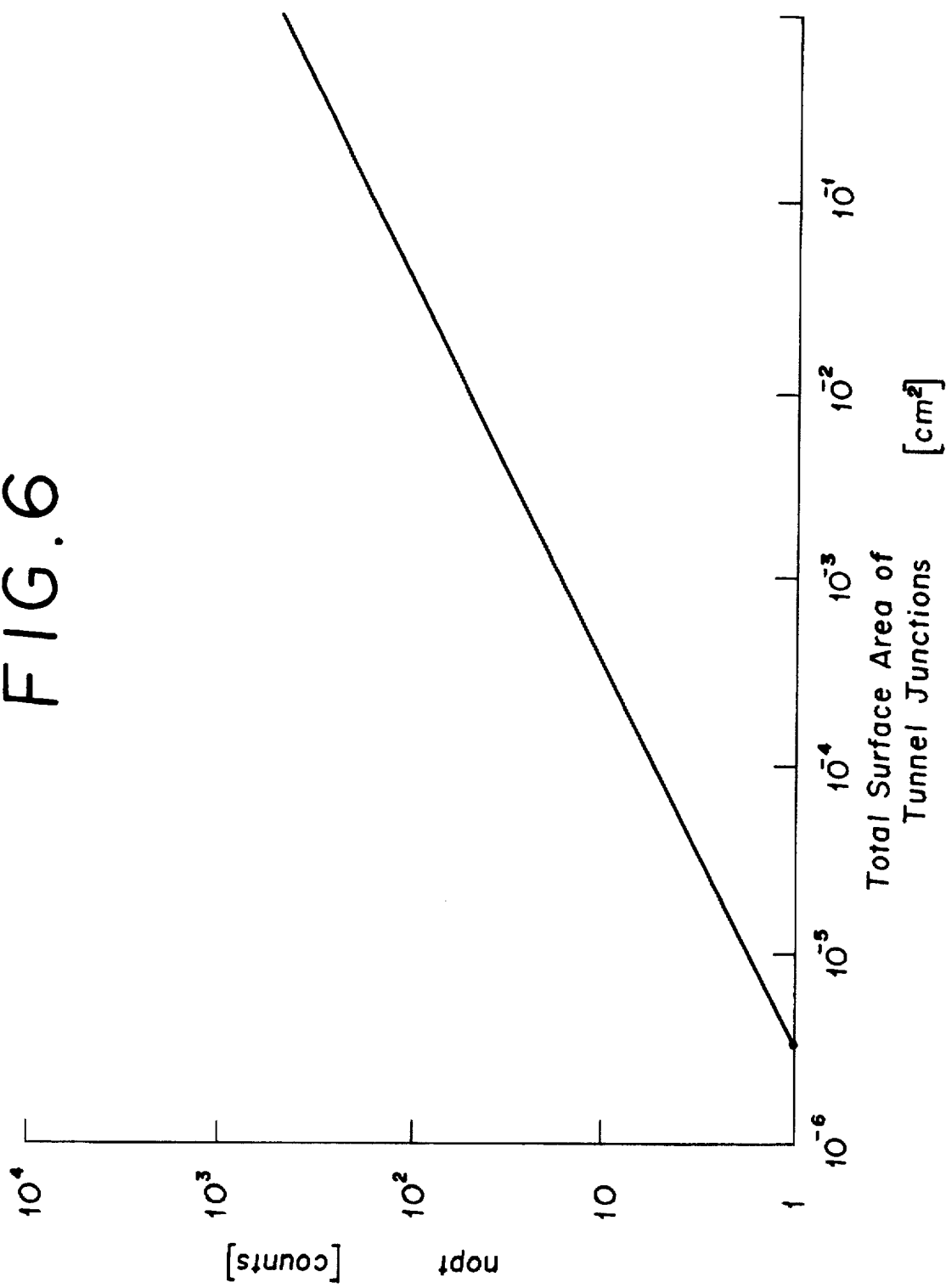
FIG. 6 is a graph showing the relation between the total area of tunnel junctions and the optimum number, $n_{opt}$, of series arrayed junctions under the conditions, C'=20 pF and $C_o$=6 μF/cm$^2$.
Figure 7:
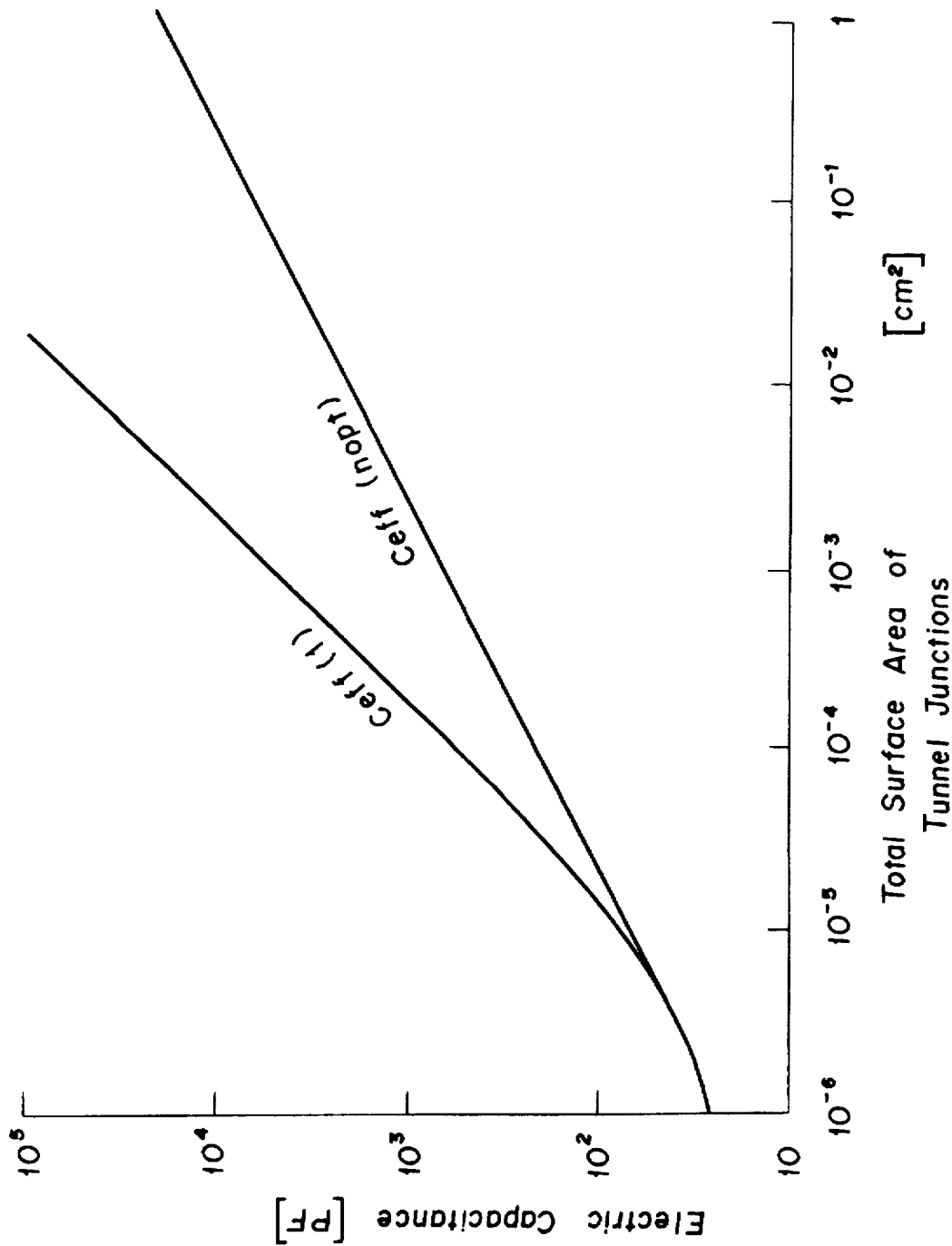
FIG. 7 is a graph showing the relation between the total area of tunnel junctions and the effective electric capacitances, $C_{ef}(1)$ and $C_{ef}(n_{opt})$, under the conditions of C'=20 pF and $C_o$=6 μF/cm$^2$.

FIG. 6 and FIG. 7 respectively show the relation between S and $n_{opt}$ and the relation between S and $C_{eff}(n_{opt})$ or Ceff(1) under the assumed conditions, C'=20 pF and $C_o$=6 μF/cm$^2$. It is clear from FIG. 7 that the ratio $C_{eff}(n_{opt})/C_{eff}(1)$ decreases and the effect of this invention becomes more significant as the S increases.

For example, on the assumption that the signal charge Q from a superconductor detector is 1,000 times larger than that from semiconductor detectors, and therefore the superconductor detector exhibits a performance superior to that of the semiconductor detectors, when $C_{eff}$ is smaller than 20 nF, S must be less than 0.0034 cm$^2$ in the conventional device in which n=1. In contrast, the present invention allows an increase in the detection area up to about 1 cm$^2$. For a fixed area, the device of this invention provides a large signal voltage as compared with the conventional device. Of course, FIG. 7 represents the data obtained under the conditions of C'=20 pF and $C_o$=6 μF/cm. When these variables decrease, a larger S becomes possible.

The electric resistance of the devices will now be described. First, we consider the case in which the electric resistance of the device is determined by the surface leak current. Assume r denotes the electric resistance per unit area of a tunnel junction, then the resistance $R_1$ of the conventional device having an area S is given by $$R_1 = r/S \tag{13}$$

In the case of a device having n junctions connected in series, each of which has a equal area and possessing a total area S of the junctions, since the area of each individual junction is inversely proportional to n and, at the same time, their electric resistances are serially accumulated, the electric resistance $R_n$ of the device is given by $$R_n = (r/S)n^2 \tag{14}$$

When n=$n_{opt}$ is satisfied, the resistance $R_{n,opt}$ is given by $$R_{n,opt} = \frac{r}{s} \cdot \frac{SC_0}{C'} = r\frac{C_o}{C'} \tag{15}$$

For example, when C'=20 pF and Co=6 μF/cm$^2$, $$R_{n,opt} = \frac{r}{3.3 \times 10^{-6} \text{ cm}^2}$$

Thus, the magnitude of $R_{n,opt}$ becomes equal to the resistance of one junction having an area of $3.33 \times 10^{-6}$ cm$^2$ (=18.3 μm×18.3 μm) without reference to S.

Next, the case in which the electric resistance of the device is determined by the edge leak current is considered. The resistance of the junction in this case is inversely proportional to the edge length of the junction. The edge length of each junction is proportional to the square root of the area of each junction. Assume ρ denotes the electric resistance of the junction per unit area in this case, then the electric resistance $R_1$ of the conventional device having an area S is given by $$R_1 = \frac{\rho}{\sqrt{S}} \tag{16}$$

and the electric resistance $R_n$ of the device having n junctions connected in series, each of which having an equal area and possessing a total area S, is given by $$R_n = \frac{\rho}{\sqrt{S/n}} \cdot n \tag{17}$$

$$= \frac{\rho}{\sqrt{S}} \cdot n^{3/2}$$

The resistance $R_{n,opt}$ for n=$n_{opt}$ is given by the following equation.

$$R_{n,opt} = \frac{\rho}{\sqrt{S}} \cdot \left(\frac{SC_o}{C'}\right)^{3/4} \tag{18}$$

$$= \rho \cdot \left(\frac{C_o}{C'}\right)^{3/4} S^{1/4}$$

Figure 8:
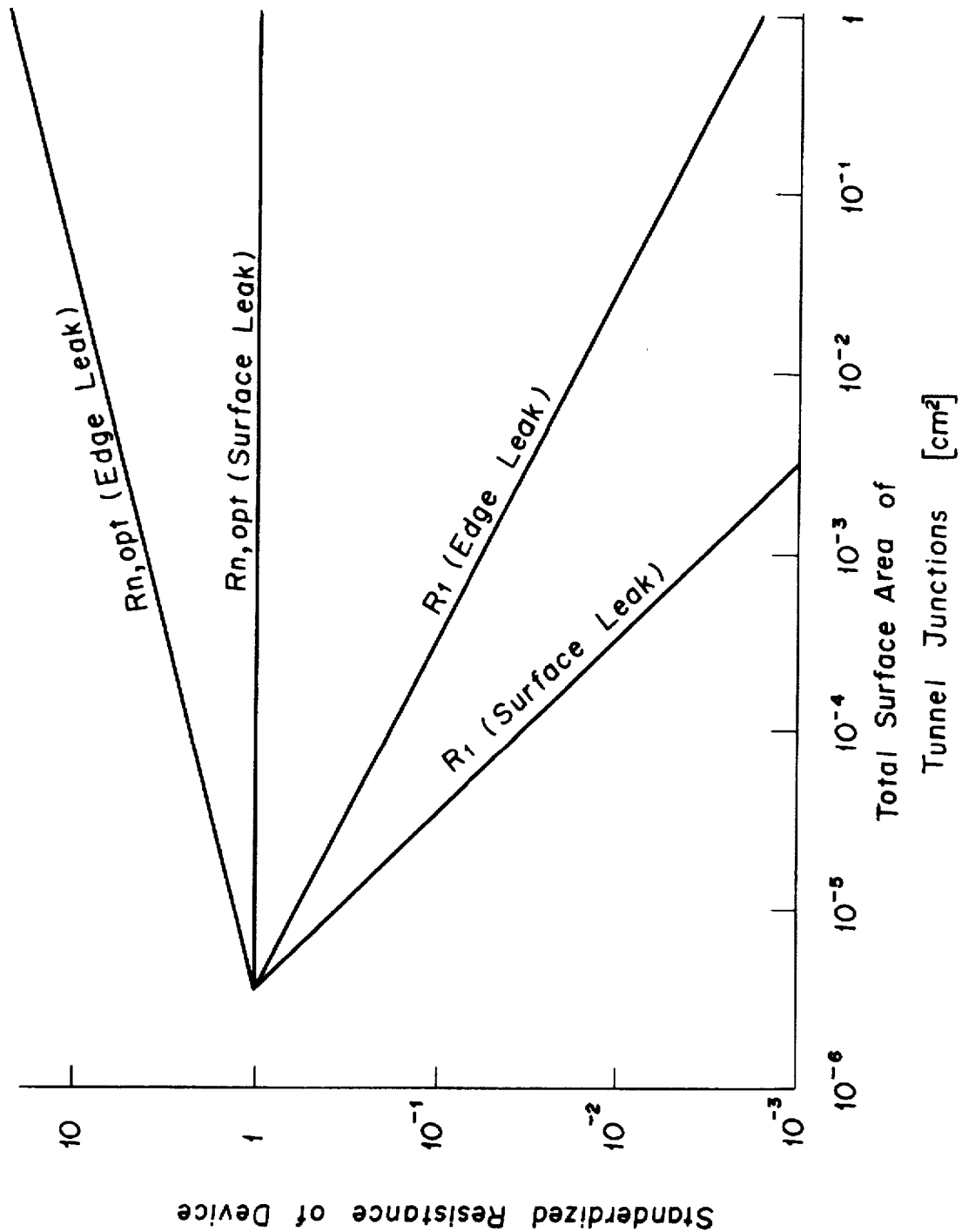
FIG. 8 is a graph showing the relation between the total area of tunnel junctions and the device resistance under the conditions of C'=20 pF and Co=6 μF/cm$^2$.

The relation between the area of the device and the resistance $R_1$ in the conventional device and the relation between the area of the device and the resistance $R_{n,opt}$ in the device of the present invention are shown in FIG. 8. Here, again, the conditions, C'=20 pF and Co=6 μF/cm$^2$, are assumed and the magnitudes, $R_1$ and $R_{n,opt}$, are specified with the resistance of the junction of $n_{opt}$=1 having an area of $3.33 \times 10^{-6}$ cm$^2$. It is clearly noted from FIG. 8 that the decrease in electric resistance attendant on the increase in area of the device can be precluded in the device of this invention, regardless of whether the electric resistance of the junction is determined by the surface leak current or by the edge leak current.

The case in which the radiation or light is directly absorbed in a superconducting tunnel junction and the signal is generated responsive to the absorption of the energy has been considered thus far.

As another method for utilizing the superconducting tunnel junction in the detection of radiation, the following concept may be cited. The determination of the radiation energy or the light intensity is accomplished by allowing the radiation or light energy to be absorbed in a certain substance, thereby causing this substance to emit phonons proportionately to the absorbed energy and measuring the phonons by the use of the superconducting tunnel junction disposed in intimate contact with the substance. This method is based on the results of the theoretical calculation that, in a superconductor, a phonon having an energy larger than the gap energy of the superconductor excites electrons very efficiently (Nucl. Instrum. and Method, 196 (1982) 275).

For the superconducting radiation detector of the type which converts radiation or light energy into phonons and measures the phonons by means of superconducting tunnel junctions, the device of this invention is highly useful. Since this invention allows a large total area of the device, just one device of this invention is enables the absorption of a greater part of the phonons emitted in response to the incident radiation or light energy, thus achieving a high energy-resolution or a high sensitivity.

The device comprising a series array of n junctions has been considered thus far. The device according to this invention may be otherwise formed by connecting m such series arrays in parallel (FIG. 9 illustrating a matrix connection of n=5 and m=3). In this case, the number of superconducting tunnel junctions of which the device is composed is mn. Assume A denotes the area of the junction portion in one junction, then S=Amn. The effective electric capacitance $C_{\mathit{eff}}$ of this device can be easily determined by substituting for C' in the equation (10) the electric capacitance, C'+(m−1)C/n, denoting the combination of C' of (m−1) series arrays. Wherein C stands for the electric capacitance of one junction $$C = C_o \frac{S}{mn}. \tag{19}$$

$$C_{\mathit{eff}} = C + n \left\{ C + (m-1)\frac{C}{n} \right\}$$

$$= C_o S \frac{1}{n} + nC$$

Therefore, $C_{\mathit{eff}}$ does not depend on m and the equation (19) yields the same results as the equation (10).

It has been assumed thus far that the junctions used in one device each have equal area and electric capacitance. Actually, when the radiation energy is absorbed by only one of the junctions, for example, when the device composed of these junctions is used for X ray detection, the magnitude of the signal voltage $V_s$ largely depends on the electric capacitance of the junction. Certainly, in this case, it is necessary that the junctions should be given an electric capacitance which is as uniform as permissible. In contrast, when light energy impinges upon the entire surface of the device or when radiation energy is converted into phonons and these phonons incides in a widely diffused state to the device, the electric capacitances of all the junctions are not always required to be uniform because all the junctions generate a signal at the same time.

In the device or the detector of this invention, the number of junctions is specified to be not less than 4 where the device consists of only one series array of junctions. The reason for this minimum of 4 is that if n is less than 4, the effect of repressing the electric capacitance to an amply low level is nominal, the effect of increasing the electric resistance is also small, and the combination of series connected junctions is not very significant. The reason for specifying n to be larger than $0.05(SC_o/C')^{0.5}$ is that if n is smaller than the specified lower limit, $C_{\mathit{eff}}$ increases to more than 10 times than that satisfied for n=$n_{opt}$ and the effect of increasing the electric resistance is small. The reason for specifying n to be smaller than $20(SC_o/C')^{0.5}$ or $10SC_o/C'$, whichever is larger, is that if n is larger than $20(SC_o/C')^{0.5}$, $C_{\mathit{eff}}$ increases to more than 10 times than that satisfied for n=$n_{opt}$ and if n is larger than $SC_o/C'$, even though $C_{\mathit{eff}}$ is larger than that in the conventional device, the effect of increasing the resistance is large, and the effect of this invention is sufficient so long as n is up to about $10(SC_o/C')$.

C' is the factor which is determined mainly by the amplifier to be used. Where the detection device is exclusively considered, $n_{opt}$ cannot be decided. It is clear, however, from the equation (12) that the effect of this invention increases as C' decreases. The amplifier which was used in two of three examples had a large input electric capacitance, C', of about 150 pF as described hereinbelow. When the input electric capacitance is decreased on account of a high energy-resolution, C' generally falls in the range of 5 to 20 pF. This explains why the number of junctions in one series array for the device of this invention has been defined to be larger than $0.05(SC_o/(20\times10^{-12} \text{ F}))^{0.5}$ and smaller than $20(SC_o/(5\times10^{-12} \text{ F}))^{0.5}$ or $10SC_o/(5\times10^{-12} \text{ F})$, whichever is larger. The number n of junctions in one series array is desired to be larger than $0.05(SC_o/(20\times10^{-12} \text{ F}))^{0.5}$ and smaller than $20(SC_o/(5\times10^{-12} \text{ F}))^{0.5}$.

Figure 9A:
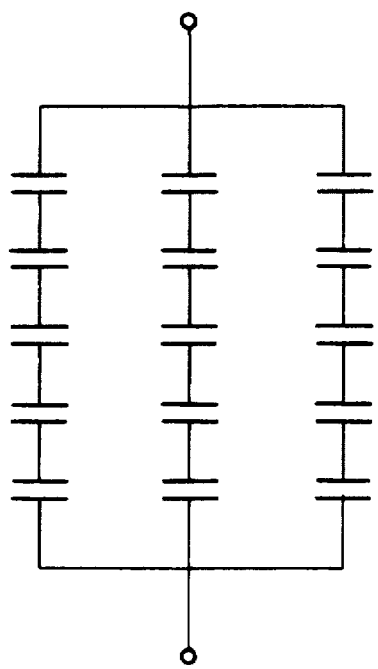
FIG. 9a is a circuit diagram illustrating a device having three series arrays connected in parallel, each array comprising five junctions in accordance with this invention.
Figure 9B:
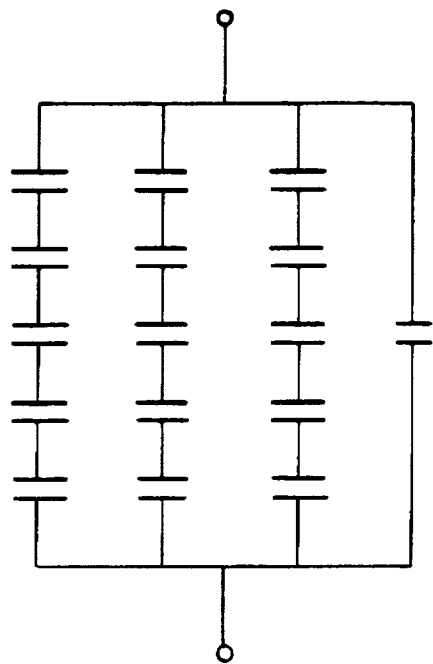
FIG. 9b is a circuit diagram illustrating another embodiment of the device in accordance with this invention.

When the radiation detection device of the present invention is in the form of a series-parallel array of junctions, it is desirable that not only one, but all of the series arrays fulfill the number of junctions conditions mentioned above. In more desirable embodiments as shown in FIG. 9a, each series array has junctions in about the same number as others. In the present invention, however, another embodiment may be also embraced where one or more members each comprising a junction and other members each comprising a series array are connected in parallel as shown in FIG. 9b, or where members each comprising a series array are connected in parallel, but one or more of the members do not fulfill the number of junction conditions, as long as the electric capacitance of such member comprising a junction or comprising a series array which is out of the number of junction conditions is amply small, and there is little influence on the the device as a whole due to the existence of such a member.

The number n of junctions in the one series in this case is specified to be not less than 4, and n is also specified to be larger than $0.05(SC_o/C')^{0.5}$ and smaller than $20(SC_o/C')^{0.5}$ or $10SC_o/C'$, whichever is larger, for the same reason as given above. The preferred range of this number is larger than $0.05(SC_o/C')^{0.5}$ and smaller than $20(SC_o/C')^{0.5}$ as described above.

EXAMPLES

Now, the present invention will be described more specifically below with reference to one embodiment, which is intended to be merely illustrative of and not in any sense limitative of the invention.

Figure 1:
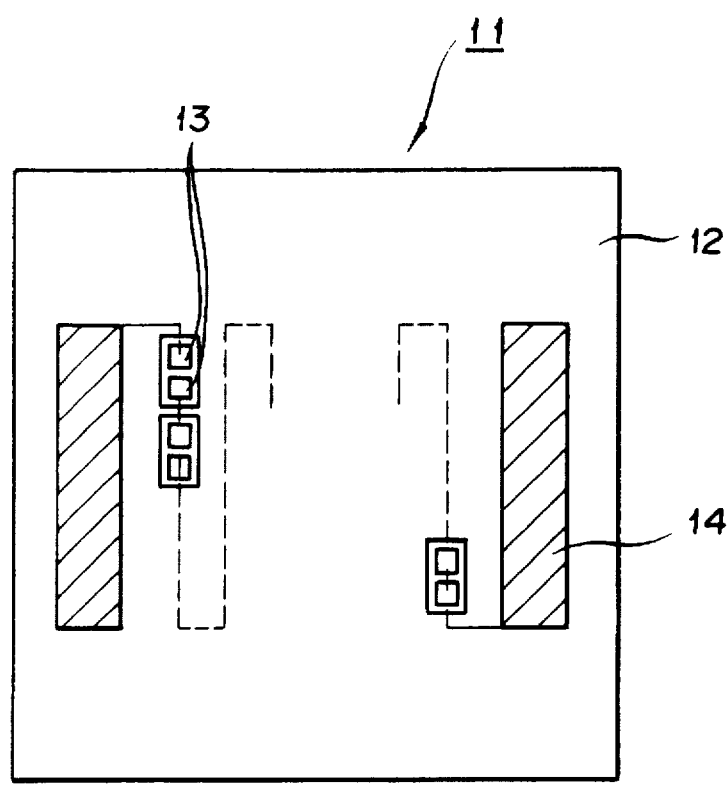
FIG. 1 is a plane view illustrating the construction of a radiation detection device as one embodiment of this invention.
Figure 10:
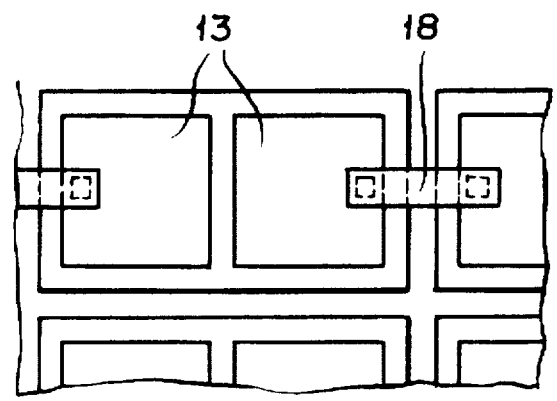
FIG. 10 is a magnified plane view illustrating part of a radiation detection device as one embodiment of the present invention.
Figure 11:
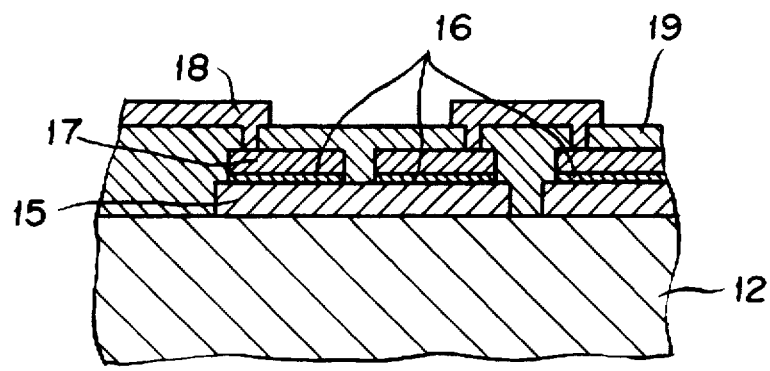
FIG. 11 is a magnified cross section view illustrating part of the embodiment.

FIG. 1 is a plane view of a device composed of serially connected junctions and fabricated in the central part of a substrate. FIG. 10 is a magnified plane view illustrating the part of a few junctions in the device and FIG. 11 is a cross section view thereof.

A device 11 was fabricated by first forming a single-crystal Nb film at a thickness of about 200 nm on the entire surface of an R-face sapphire substrate 12, then forming thereon a polycrystalline Nb film at a thickness of about 20 nm, further forming thereon an aluminum film at a thickness of about 10 nm, and oxidizing the surface of the resultant aluminum layer, thereby forming a tunnel barrier $AlO_x$. Thereafter, a polycrystalline Nb film was formed thereon at a thickness of about 200 nm. The Nb-$AlO_x$-Nb (lower superconducting layer-insulating layer-upper superconducting layer) construction formed on the sapphire substrate was finely fabricated by the SNIP method (Appl. Phys. Lett, 41 (1982) 1097) to form a plurality of junctions 13. The upper wirings to interconnect these junctions were subsequently produced by forming a Nb film and subjecting this Nb film to fine fabrication. In FIG. 11, the reference numeral 15 denotes a lower superconductor (Nb), the reference numeral 16 a tunnel barrier (AlO$_x$), the reference numeral 17 an upper superconductor (Nb), the reference numeral 18 an upper wiring (Nb), and the reference numeral 19 an insulator (SiO). The reason for using a single-crystal Nb film on the fabrication of the junctions was that the electrons excited in the lower superconductor 15 would be enabled to be efficiently and quickly taken out as signals by the tunnel effect. In the case of the present embodiment, the epitaxial growth of Nb on the sapphire substrate 12 was aimed, if not exclusively, at facilitating the passage of phonons from the substrate 12 to the lower superconductor 15.

Two kinds of devices were produced, a device having connected in series 8,000 junctions of an area of 20 μm×20 μm in the junction portion per junction (Device A) and two devices each having connected in series 960 junctions of an area of 100 μm×100 μm in the junction portion per junction (Devices B and C). In each of these devices, the part covered by the densely arranged junctions (hereinafter referred to as "device region") occupied an area of 0.16 cm$^2$. The total area of the junction portions was 0.032 cm$^2$ in Device A and 0.096 cm$^2$ in Devices B and C, the values being about 1,000 times larger as those common in the conventional superconducting radiation detection devices.

The signals from the device A were led through a cable to a charge-sensitive type preamplifier of 0.45 V/pC and amplified therein. The initial-stage amplifier of the preamplifier was a junction type FET. The output of the preamplifier was further subjected to amplification and waveform adjustment in a main amplifier, then input to a multi-channel pulse height analyzer, and dispersed therein for measurement of the pulse height spectrum of the signals. The signals from the device B were amplified and analyzed in the same manner and construction. The total electric capacitance C' of the FET and the cable was about 150 pF. The value of $n_{opt}$ determined by the equation (7) was 36 for Device A of S=0.032 cm$^2$ and 62 for Device B of S=0.096 cm$^2$ under the conditions of C'=150 pF and Co=6 μF/cm$^2$. It is plain that neither Device A nor Device B was optimized, but Device B (using 960 junctions) was closer to the optimum condition than Device A (using 8,000 junctions). Actually, the value of $C_{eff}$ found by the equation (10) was 1.2 μF for Device A and 144.6 nF for Device B, indicating that Device B having a larger value for the total area S of the junction portions showed a smaller value of $C_{eff}$.

The signals from Device C were amplified in a preamplifier with a FET having a small input electric capacitance. In this case, the total electric capacitance C' was estimated at about 20 pF. The value of $n_{opt}$ was 170 under the conditions of C'=20 pF, Co=6 μF/cm$^2$ and S=0.096 cm$^2$. The value of $C_{eff}$ was about 53 nF for Device C.

In Device A, $$n = 224\, n_{opt} + 224(SC_o/C')^{1/2}$$

$$= 6.25\, n^2_{opt} = 6.25(SC_o/C')$$

and in Device B, $$n = 15.5\, n_{opt} = 15.5(SC_o/C')^{1/2}$$

$$= 0.25\, n^2_{opt} = 0.25(SC_o/C')$$

and in Device C,

-continued $$n = 5.6\, n_{opt} = 5.6(SC_o/C')^{1/2}$$

$$= 0.033\, n^2_{opt} = 0.033(SC_o/C').$$

The values of n of Device A, Device B and Device C were found to fall in the range according to this invention.

Figure 12:
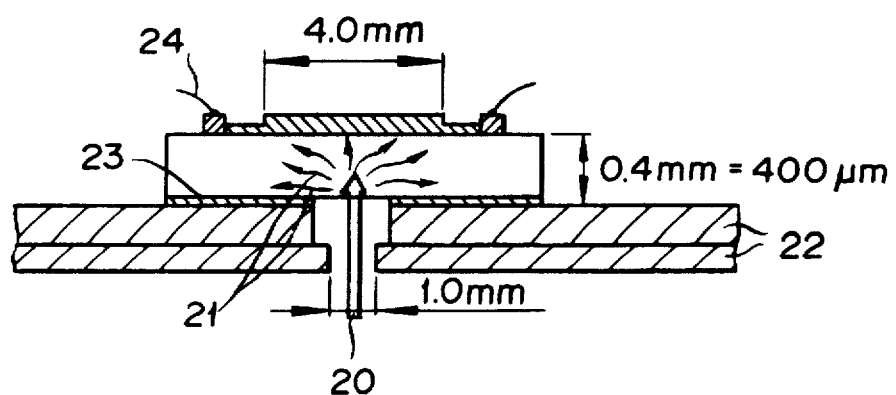
FIG. 12 is a typical diagram illustrating the method for determination of 5.3 MeV α particles in accordance with one embodiment of this invention.

These devices were irradiated with α particles 20 of 5.3 MeV from the rear side of the substrate 12 as illustrated in FIG. 12. The sapphire substrate 12 had a thickness of about 400 μm, amply larger than the range, 20 to 30 μm, of the α particles 20 in the sapphire. As a result, the α particles 20 lost their energy on the reverse side of the substrate 12 and this energy was converted into phonons 21. The detection of the α particles 20 was attained by detecting the phonons 21 with the device 11 on the obverse side of the substrate 12. In FIG. 12, the reference numeral 22 denotes a copper sheet, the reference numeral 23 a varnish coating, and the reference numeral 24 a signal conductor.

Figure 13:
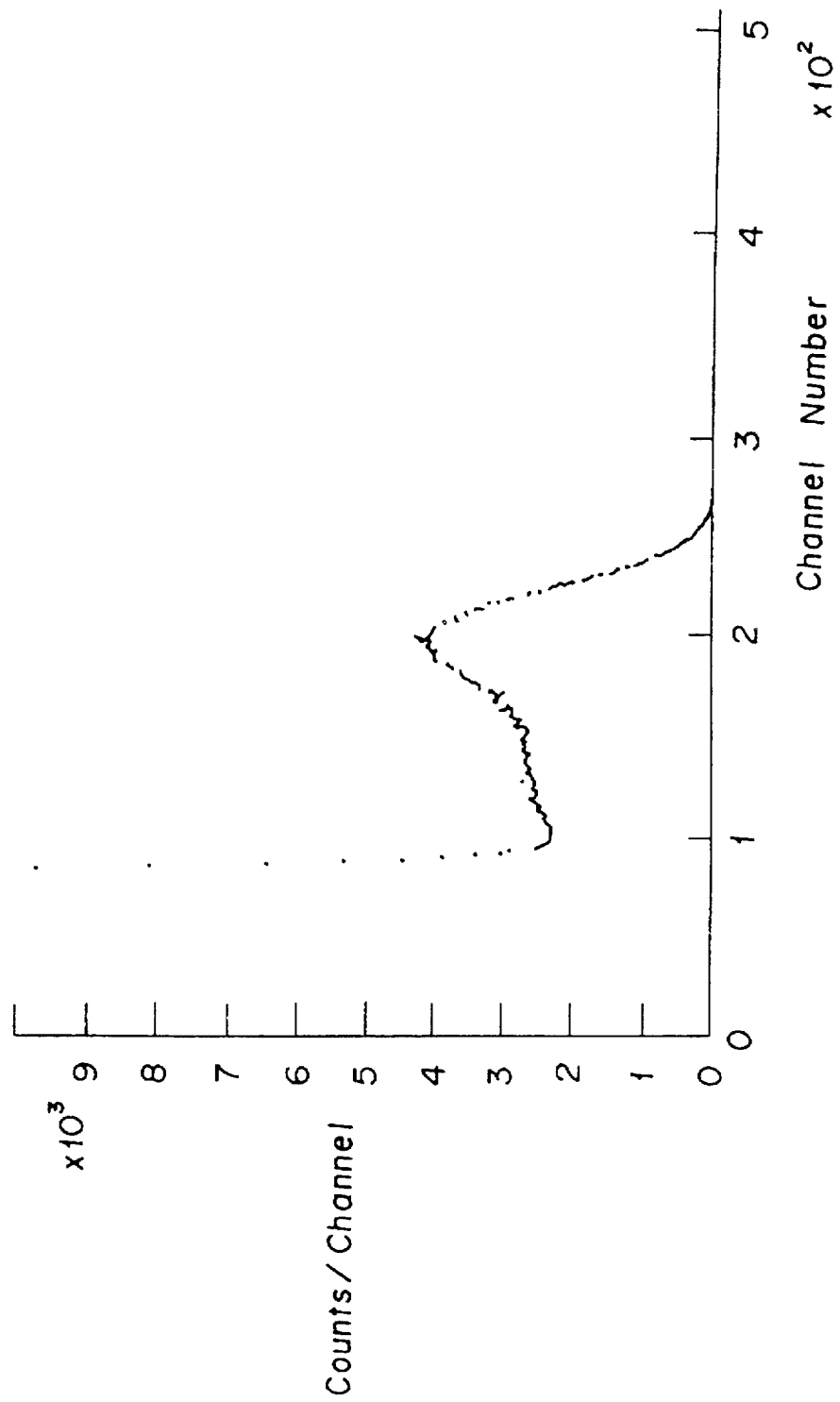
FIG. 13 is a pulse height spectrum chart of the signals by the impinging 5.3 MeV α particles on the device A as one embodiment of this invention.

FIG. 13 represents a pulse height spectrum of the signals in Device A. The vertical axis is the scale of the size of a signal generated by each of the α particles and the vertical axis the scale of the counts of the signals occurred at an indicated size within the indicated time of measurement. In FIG. 13, the number of counts was large in the portion of the horizontal axis from 0 to 100 channels because of noise and the number of counts obtained in the portion of the horizontal axis on the right of 100 channels represented the size of the signal generated by the α particles. The magnitude of the signal at a peak in the neighborhood of 200 channels was about 1 mV in terms of preamplifier output.

These results will be compared below with those obtained by the use of the conventional superconducting radiation detection device. In the conventional device comprising a junction with an area S=0.032 cm$^2$, the electric capacitance was found to be 192 nF, a value smaller than $C_{eff}$=1.2 μF of Device A. With respect to the device resistance, however, a large difference existed between the conventional device and Device A. The electric resistance of Device A where n=8,000 was about 100 kΩ. By calculation based on this value, the electric resistance of the conventional device having S=0.032 cm$^2$ would be found as follows.

$$100\, k\Omega \div (8000)^2 = 0.0016\, \Omega \text{ (surface leak) to}$$

$$100\, k\Omega \div \{(0.032)/(0.032 + 8000)\}0.5 \div 8000 = 0.14\, \Omega \text{ (edge leak)}$$

The result indicates that the signals would be attenuated (discharged) with a very short time constant of RC=0.3 to 27 ns. It is assumed on the other hand that the occurrence of a signal, namely, the excitation of phonons by radiation energy—transfer of phonons through the substrate—excitation of electrons by incidence of phonons into the superconductor—diffusion and tunneling of excited electrons within the superconductor, would need a time of about 1 μs. If the attenuation time was 0.3 to 27 ns and, therefore, was far shorter than the time required for the signal occurrence, the signal voltage would be far smaller than could be expected from $V_s$=Q/C. In Device A, the time constant RC was amply longer than the time required for the signal occurrence, making it possible to effect the detection of a signal illustrated in FIG. 13.

Although Device A of the present embodiment has a fairly large effective electric capacitance as compared with the conventional device, the fact that this invention allows an increase of the device resistance clearly evinces the advantageous effects of the invention.

Figure 14:
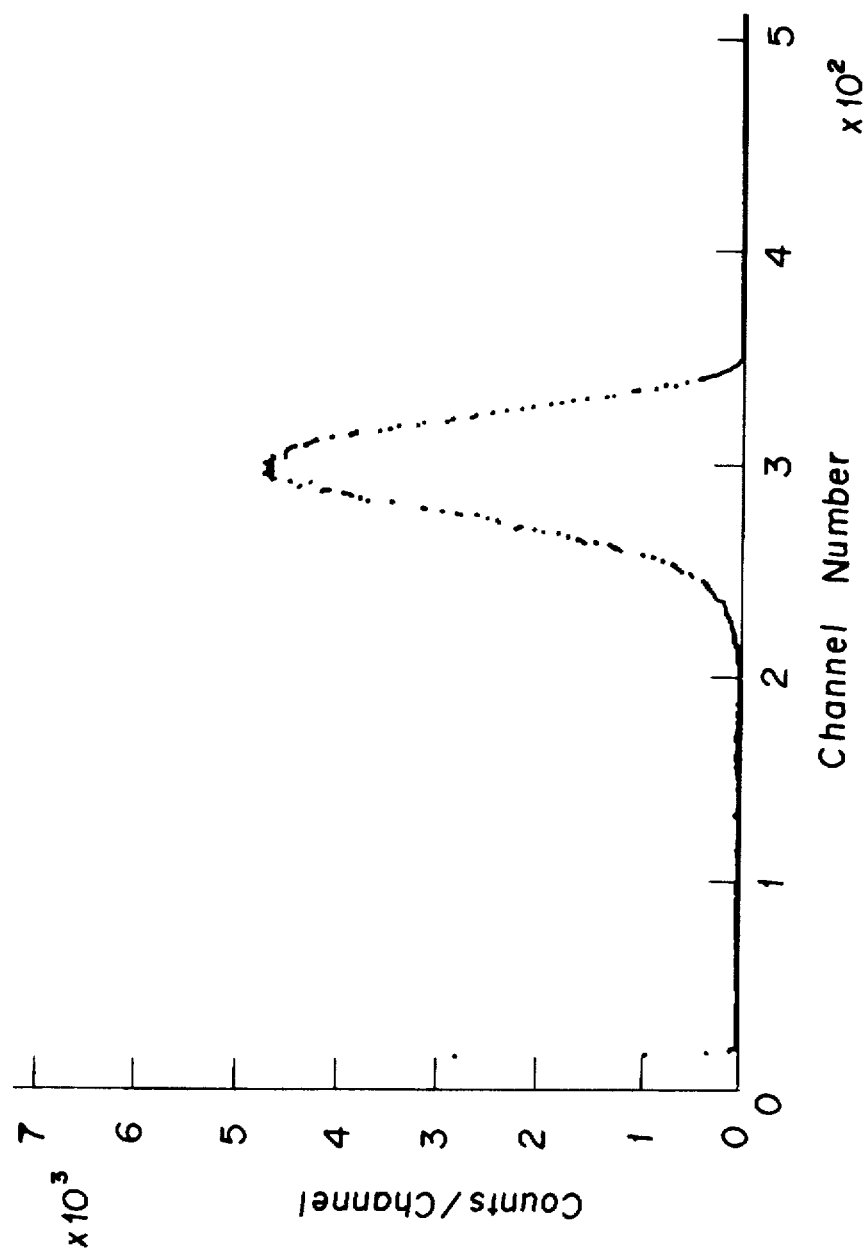
FIG. 14 is a pulse height spectrum chart of the signals by the impinging 5.3 MeV α particles on the device B as one embodiment of this invention.
Figure 15:
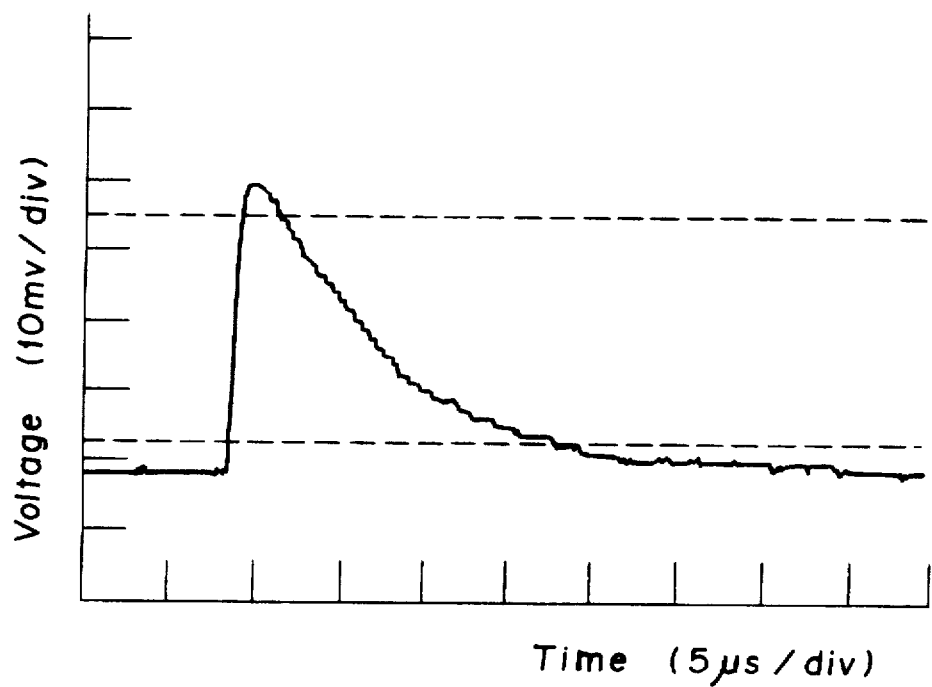
FIG. 15 is a diagram illustrating the preamplifier output pulse shape of the signal from the device B.
Figure 16:
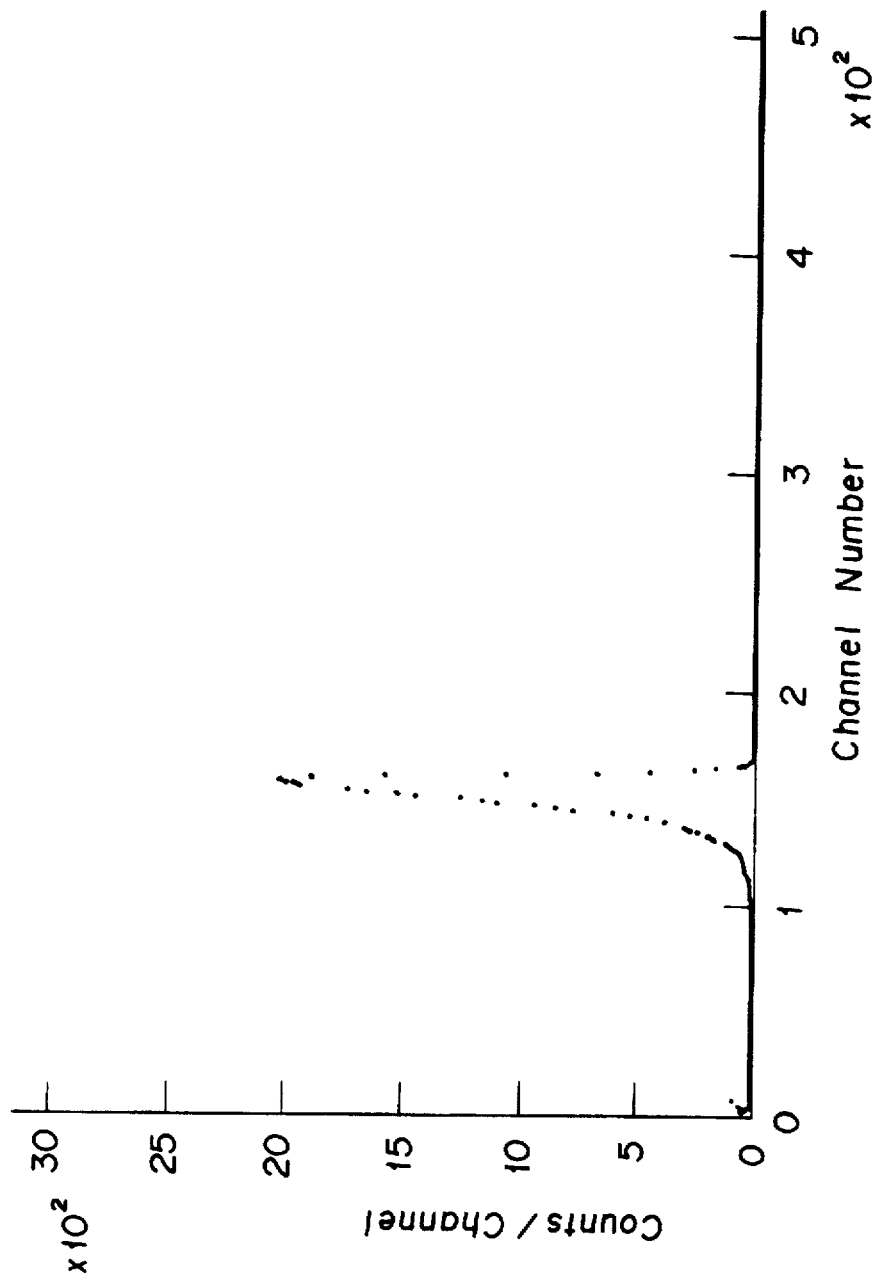
FIG. 16 is a pulse height spectrum chart of the signals by the impinging 5.3 MeV α particles on the device C as one embodiment of this invention.

FIG. 14 represents a pulse height spectrum of the signals in Device B. The magnitude of the signal in this case was as large as about 40 mV in terms of preamplifier output. As a result, the amplification factor of the main amplifier was set at a level roughly one decimal place lower than that in the device of FIG. 13. In this case, the pulse height spectrum of the signals generated by the α particles showed a prominent peak, clearly indicating that the detector under discussion can be used for the discrimination of the radiation energy. The pulse shape of preamplifier output of the signals generated by the α particles with Device B is illustrated in FIG. 15. The rise time of the signal was as brief as about 1 μs, justifying the high response speed in spite of the intervention of phonons in the detection of radiation. The attenuation time of the signal was about 10 μs, a length amply larger than the rise time of the signal. Further, a pulse height spectrum of signals in Device C is illustrated in FIG. 16. In this case, the pulse height spectrum of the signals generated by the α particles showed a prominent peak than that in the case of Device B.

The amount of the signal charge Q caused by the 5.3 MeV α particles in the present embodiment will now be described. If this charge amount is small, the proportion of the statistic fluctuation of the charge amount is too large to warrant due expectation of a high energy resolution.

When the signal charge amount Q is to be calculated from the output of the charge-sensitive type preamplifier, $V_{out}$, attention should be paid to the fact that the electric capacitance as viewed from outside the device, $C_{out}=(C/n)+C'$, in a parallel arrangement of the input electric capacitance of preamplifier and the electric capacitances of signal conductor and the device is different from the effective electric capacitance, $C_{eff}$ (=C+nC'), for the charge generated in the device, where C denotes the electric capacitance per junction. This is because, as is widely known, the charge-sensitive type preamplifier for use in the conventional semiconductor radiation detection device comprising one junction is so adapted that the magnitude of the preamplifier output, $V_{out}$, is fixed exclusively by the signal charge and not by the electric capacitance of the device. To be more specific, although the signal voltage $V_s$ generated in the output of the preamplifier decreases in proportion as the magnitude of $C_{out}$ increases, the charge-sensitive type preamplifier is so adapted that the voltage amplification factor thereof automatically increases in proportion to the magnitude of $C_{out}$ and, as a result, the magnitude of its output, $V_{out}$, is determined not by $C_{out}$ but solely by Q. The determination of the charge amount Q of the signal in the device of this invention having different magnitudes of $C_{out}$ and $C_{eff}$ based on the magnitude of the signal output of the charge-sensitive type preamplifier, therefore, may be attained as follows.

The voltage amplification factor, G, of the preamplifier is proportional to $C_{out}$. Let k denote the constant of this proportion, then the following equation is satisfied.

$$G=k\ C_{out} \quad (20)$$

From this equation, the following equation is derived.

$$V_{out}=k\ C_{out}\ V_s \quad (21)$$

In contrast, the following relations are satisfied by the conventional device.

$$V_s = \frac{Q}{C_{out}} \quad (22)$$

$$V_{out}=k\ Q \quad (23)$$

The constant k would be determined in accordance with the type of preamplifier. For instance, in the charge-sensitive type preamplifier used for determination in both constructions using Device A and using Device B, the constant k is 0.45 V/pC.

In contrast, in the embodiment of this invention described above, since the equation (9) is carried out, $$V_s = \frac{Q}{C_{eff}} \quad (9)$$

the following expressions are established.

$$V_{out} = kC_{out}\frac{Q}{C_{eff}} \quad (24)$$

$$= k\frac{\frac{C}{n}+C'}{C+nC'}Q \quad (25)$$

$$= \frac{1}{n}\ kQ \quad (26)$$

From the equation (26), $$Q=n\frac{1}{k}\ V_{out} \quad (27)$$

From the equation (27), Q=18 pC is derived for Device A and Q≅90 pC for Device B, indicating that their signal charge amounts Q were respectively about 76 times and about 380 times the amount of a Si detector (Q=about 0.24 pC for the 5.3 MeV radiation) which has the highest energy resolution in all the conventional semiconductor detectors. Further, for Device C, a signal charge amount Q which is about 400 times the amount of the Si detector. The difference in the signal charge amount Q between Device A and Device B or Device C may be logically explained by the fact that the efficiency with which the phonons 29 are absorbed by the superconductor is different between the two devices because, in the device region which is equally 4 mm×4 mm in both the devices, the area covered by the lower superconductor is different between the devices. Otherwise, the difference may be explained by the fact that the manner in which the copper sheet 22 is attached fast to the reverse side of the sapphire substrate 12 is different between the two devices and, as a result, the proportion of the leakage of phonons 21 to the copper sheet 12 is different between the two devices.

Paradoxically, the fact that the signal charge amount obtained by one device of this invention is about 400 times that obtained by the conventional Si semiconductor detector in spite of the diffusion of phonons 21 well evinces the advantageous effects on the radiation detection by the increase in area of the device according to this invention.

It should be understood that the foregoing description relates only to the scope of this invention defined by the appended claims rather than by the description preceding them and that all changes to be made without departure from the spirit of the invention defined by the claims and equivalents of such changes are, therefore, intended to be embraced by the claims.

We claim:

1. A radiation detection device comprising:
a series connection of N superconducting tunnel junctions;
wherein N is an integer which is greater than the larger of A and B, and which is less than the larger of C and D;
wherein
A=3,
B=0.05(SC$_o$/(20×10$^{-12}$F))$^{0.5}$, $C=20(SC_o/(5\times10^{-12}F))^{0.5}$, and
$D=10SC_o/(5\times10^{-12}F)$;

wherein F denotes farads, S denotes a total area of said N superconducting tunnel junctions in $cm^2$, and $C_o$ denotes an electric capacitance per unit area of said N superconducting tunnel junctions in $F/cm^2$.

2. A radiation detection device as recited in claim 1, wherein N is greater than B and less than C.

3. A radiation detection device comprising:

at least two parallel connected members each comprising at least one superconducting tunnel junction;

wherein at least one of said parallel connected members is formed of a series connection of N superconducting tunnel junctions;

wherein N is an integer which is greater than the larger of A and B, and which is less than the larger of C and D;

wherein
$A=3$,
$B=0.05(SC_o/(20\times10^{-12}F))^{0.5}$,
$C=20(SC_o/(5\times10^{-12}F))^{0.5}$, and
$D=10SC_o/(5\times10^{-12}F)$;

wherein F denotes farads, S denotes a total area of all of the superconducting tunnel junctions of said members in $cm^2$, and $C_o$ denotes an electric capacitance per unit area of all of the superconducting tunnel junctions of said members in $F/cm^2$.

4. A radiation detection device as recited in claim 3, wherein N is greater than B and less than C.

5. A radiation detection device as recited in claim 3, wherein at least two of said parallel connected members are formed of a series connection of superconducting tunnel junctions, the number of superconducting junctions of each of said at least two parallel connected members being an integer which is greater than the larger of said A and B, and which is less than the larger of said C and D.

6. A radiation detector comprising:

a signal amplifier; and, a radiation detection device, coupled to an input of said signal amplifier, comprising a series connection of N superconducting tunnel junctions;

wherein N is an integer which is greater than the larger of A and B, and which is less than the larger of C and D;

wherein
$A=3$,
$B=0.05(SC_o/C')^{0.5}$,
$C=20(SC_o/C')^{0.5}$, and
$D=10SC_o/C'$;

wherein S denotes a total area of said N superconducting tunnel junctions in $cm^2$, $C_o$ denotes an electric capacitance per unit area of said N superconducting tunnel junctions in $farads/cm^2$, and C' denotes an input electric capacitance of said input of said signal amplifier in farads.

7. A radiation detector as recited in claim 6, wherein N is greater than B and less than C.

8. A radiation detector comprising:

a signal amplifier;

a radiation detection device, coupled to an input of said signal amplifier, comprising at least two parallel connected members each including at least one superconducting tunnel junction;

wherein at least one of said parallel connected members is formed of a series connection of N superconducting tunnel junctions;

wherein N is an integer which is greater than the larger of A and B, and which is less than the larger of C and D;

wherein
$A=3$,
$B=0.05(SC_o/C')^{0.5}$,
$C=20(SC_o/C')^{0.5}$, and
$D=10SC_o/C'$;

wherein S denotes a total area of all of the superconducting tunnel junctions of said members in $cm^2$, $C_o$ denotes an electric capacitance per unit area of all of the superconducting tunnel junctions of said members in $farads/cm^2$, and C' denotes an input electric capacitance of said input of said signal amplifier in farads.

9. A radiation detector as recited in claim 8, wherein N is greater than B and less than C.

10. A radiation detector as recited in claim 8, wherein at least two of said parallel connected members is formed of a series connection of superconducting tunnel junctions, the number of superconducting junctions of each of said at least two parallel connected members being an integer which is greater than the larger of said A and B, and which is less than the layer of said C and D.

* * * * *